(12) United States Patent
Sasaki

(10) Patent No.: US 8,436,479 B2
(45) Date of Patent: May 7, 2013

(54) SEMICONDUCTOR DEVICE HAVING A CHIP BONDING USING A RESIN ADHESIVE FILM AND METHOD OF MANUFACTURING THE SAME

(75) Inventor: Akitsugu Sasaki, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 33 days.

(21) Appl. No.: 13/122,034

(22) PCT Filed: Jul. 16, 2009

(86) PCT No.: PCT/JP2009/003359
§ 371 (c)(1),
(2), (4) Date: Mar. 31, 2011

(87) PCT Pub. No.: WO2010/044179
PCT Pub. Date: Apr. 22, 2010

(65) Prior Publication Data
US 2011/0180939 A1  Jul. 28, 2011

(30) Foreign Application Priority Data

Oct. 16, 2008 (JP) .............................. P2008-267030
Apr. 23, 2009 (JP) .............................. P2009-105605

(51) Int. Cl.
*H01L 23/14* (2006.01)
*H01L 29/40* (2006.01)
*H01L 21/00* (2006.01)

(52) U.S. Cl.
USPC ........................... 257/783; 257/702; 438/118

(58) Field of Classification Search .................. 257/702, 257/783; 438/118
See application file for complete search history.

(56) References Cited

U.S. PATENT DOCUMENTS 5,286,679 A * 2/1994 Farnworth et al. ............ 438/118
5,714,405 A * 2/1998 Tsubosaki et al. ............ 438/118

(Continued)

FOREIGN PATENT DOCUMENTS

CN   1873939 A   12/2006
CN   101133487 A   2/2008

(Continued)

OTHER PUBLICATIONS

Extended European Search Report issued May 24, 2012, in European Patent Application No. 09820358.1.

(Continued)

*Primary Examiner* — Long Tran
*Assistant Examiner* — Dzung Tran
(74) *Attorney, Agent, or Firm* — Birch, Stewart, Kolasch & Birch, LLP

(57) ABSTRACT

Provided is a method of manufacturing a semiconductor device capable of adhering semiconductor elements and a support member for mounting semiconductor elements, such as lead frames, organic substrates or the like, even in a relatively low temperature range without damaging adhesion property and workability and of suppressing the occurrence of voids. The method of manufacturing a semiconductor device according to the invention is a method of manufacturing a semiconductor device comprising a semiconductor element and a support member adhered to the semiconductor element through a cured material of an adhesive film, wherein the method comprises the steps (a) to (d) in this order;

(a) preparing adhesive film-attached semiconductor elements;
(b) thermocompression-bonding said adhesive film-attached semiconductor elements to said support member so as to obtain a semiconductor part made of said adhesive film-attached semiconductor elements and said support member;
(c) heating and pressurizing said semiconductor part made of said adhesive film-attached semiconductor elements and said support member using a pressurized fluid so as to proceed with curing of adhesive film; and
(d) electrically connecting said adhesive film-attached semiconductor elements and said support member.

12 Claims, 6 Drawing Sheets

U.S. PATENT DOCUMENTS

| | | | |
|---|---|---|---|
| 5,923,957 A | 7/1999 | Song et al. | |
| 6,042,682 A * | 3/2000 | Funaya et al. | 156/273.3 |
| 6,436,732 B2 * | 8/2002 | Ahmad | 438/118 |
| 6,537,856 B2 * | 3/2003 | Akram | 438/118 |
| 6,650,019 B2 * | 11/2003 | Glenn et al. | 257/777 |
| 7,135,770 B2 | 11/2006 | Nishiyama et al. | |
| 7,268,438 B2 | 9/2007 | Nishiyama et al. | |
| 7,449,406 B2 | 11/2008 | Nishiyama et al. | |
| 7,749,888 B2 | 7/2010 | Nishiyama et al. | |
| 7,776,626 B2 | 8/2010 | Hasebe et al. | |
| 7,906,370 B2 | 3/2011 | Morita | |
| 8,357,933 B2 | 1/2013 | Hasebe et al. | |
| 2003/0151140 A1 | 8/2003 | Nishiyama et al. | |
| 2006/0065978 A1 | 3/2006 | Nishiyama et al. | |
| 2007/0020912 A1 | 1/2007 | Nishiyama et al. | |
| 2007/0241434 A1 * | 10/2007 | Inada et al. | 438/118 |
| 2008/0211086 A1 * | 9/2008 | Morita | 257/702 |
| 2009/0017565 A1 | 1/2009 | Hasebe et al. | |
| 2009/0035893 A1 | 2/2009 | Nishiyama et al. | |
| 2010/0277192 A1 | 11/2010 | Hasebe et al. | |

FOREIGN PATENT DOCUMENTS

| | | |
|---|---|---|
| EP | 1 936 876 A2 | 6/2008 |
| JP | 6-264035 A | 9/1994 |
| JP | 10-50930 A | 2/1998 |
| JP | 2002-121530 A | 4/2002 |
| JP | 2002-256235 A | 9/2002 |
| JP | 2003-96426 A | 4/2003 |
| JP | 2008-159819 A | 7/2008 |
| JP | 2009-64903 A | 3/2009 |

OTHER PUBLICATIONS

International Search Report, dated Oct. 27, 2009, issued in PCT/JP2009/003359.

Office Action for corresponding Chinese Patent Application No. 200980141197.8, dated Jan. 7, 2013.

* cited by examiner (a1)

(a2-1)

(a2-2)

(a3)

(a)

(b)

(c)

SEMICONDUCTOR DEVICE HAVING A CHIP BONDING USING A RESIN ADHESIVE FILM AND METHOD OF MANUFACTURING THE SAME

TECHNICAL FIELD

The present invention relates to a method of manufacturing a semiconductor device and a semiconductor device.

BACKGROUND ART

In recent years, as electronic devices are becoming more sophisticated, there is a strong demand for semiconductor devices to be increasingly highly dense and integrated, and efforts are thus being made to make semiconductor devices (hereinafter also referred to as "semiconductor package" or "package") to be higher in capacity and density. To satisfy such demands, for example, a lead on chip (LOC) structure in which a lead frame is adhered on a semiconductor element (hereinafter also referred to as "semiconductor chip" or "chip") is employed. In the LOC structure, since a semiconductor element and a lead frame are combined, adhesion reliability at the joining area significantly affects the reliability of a semiconductor device.

In the past, an adhesive paste has been used to adhere a semiconductor element to a lead frame, but it was not always easy to apply the adhesive paste in an appropriate amount, and therefore there were cases in which the adhesive was squeezed out to the periphery of the semiconductor element.

To solve such a problem, for example, in the LOC structure, a film-type adhesive including an adhesive coated on a heat-resistant substrate, such as a hot melt-type adhesive film using a polyimide resin or the like, has been used (for example, refer to Patent Document 1). However, such a hot melt-type adhesive film needs to be applied under the high temperature, and therefore there were cases in which high density semiconductor elements and lead frames is thermal damaged.

In addition, in the recent semiconductor devices, there have been semiconductor devices that stack a semiconductor element on another semiconductor element in multiple layers, thereby making semiconductor devices smaller, thinner and larger in capacity. In such semiconductor devices, instead of the lead frame, the use of an organic substrate, such as a bismaleimide triazine substrate or a polyimide substrate, is increasing. With such an increase in organic substrates, it has become an important technical problem to avoid the occurrence of cracking caused by absorbed moisture inside the semiconductor device during the infrared reflow for soldering the semiconductor device, and it has been found that particularly the adhesive for semiconductor elements plays a very large role in such a technical problem.

The organic substrate used in semiconductor devices with a chip on chip (COC) structure in which a semiconductor element is stacked on another semiconductor element in multiple layers is not oriented for adhesion in a high temperature due to the inferior heat resistance compared with a lead frame. In addition, in a semiconductor device with a COC structure, the semiconductor element becomes thinner as the semiconductor device becomes thinner, and therefore thus far a problem occurs where the semiconductor element is significantly warped at a high adhesion temperature. From this, the demand is intensifying for a film-like adhesive capable of better than ever thermocompression bonding at a low temperature. As such a film-like adhesive, a hot melt-type adhesive film made of a mixture of a thermoplastic resin and a thermosetting resin has been suggested (for example, refer to Patent Reference No. 2 to No. 4).

Patent Reference No. 1: Japanese Laid-open Patent Application Publication No. H06-264035
Patent Reference No. 2: Japanese Laid-open Patent Publication No. 2002-121530
Patent Reference No. 3: Japanese Laid-open Patent Publication No. 2002-256235
Patent Reference No. 4: Japanese Laid-open Patent Publication No. 2003-096426

DISCLOSURE OF THE INVENTION

However, the related art described in the above references have room for improvement from the following standpoints. Firstly, in Patent Document 2, since a polyimide resin and an epoxy resin are used as a thermoplastic resin and a thermosetting resin, respectively, such an adhesive film is excellent in heat resistance and reliability, but since the melt viscosity is lowered first in a high temperature state, and, furthermore, the minimum melt viscosity is high, the wettability becomes deficient at a low temperature and thus adhesion at a low temperature of about from 80° C. to 150° C. is difficult, and therefore there is a problem in that it is difficult to apply to a semiconductor device in which semiconductor elements are thin and stacked in multiple layers.

Secondly, in Patent Reference No. 3, a resin including the main component of acrylic rubber as a thermoplastic resin with a low glass transition temperature is used to improve the wettability at a low temperature, but, due to the large molecular weight of the thermoplastic resin, the fluidity of the film-type adhesive is too poor to eliminate the difference in level caused by circuits provided on an organic substrate, and therefore there are problems in that cavities remain and flaking is liable to occur at a high temperature.

Thirdly, Patent Reference No. 4 describes an adhesion member including two kinds of adhesive layers of an adhesive layer A having a high adhesion force during thermosetting and an adhesive layer B having a high interconnect-embedding property, but, since the adhesion member includes the adhesive layer B with a large amount of flow to improve the interconnect-embedding property, there remains a problem in that the squeezing-out of the adhesive to the peripheries of semiconductor elements could not be suppressed.

Fourthly, a method is also considered in which the content of a low-molecular-weight thermosetting component is increased so as to provide fluidity, thereby eliminating the difference in level on an organic substrate, but the flexibility of the film-like adhesive becomes deficient, and therefore it can easily be expected that, in a case in which dicing tape-attached adhesive films are laminated on the rear surface of a wafer or the like, a problem will occur in that the film-like adhesive becomes liable to fracture.

The object of the present invention is to provide a method of manufacturing a semiconductor device capable of adhering semiconductor elements and a support member for mounting semiconductor elements, such as lead frames, organic substrates or the like, even in a relatively low temperature range without damaging the adhesion property and workability and of suppressing the occurrence of voids. In addition, the object of the invention is to provide a semiconductor device which is manufactured by the above method of manufacturing a semiconductor device and excellent in reliability.

According to the invention, there is provided a method of manufacturing a semiconductor device comprising a semiconductor element and a support member adhered to the semiconductor element through a cured material of an adhesive film, wherein the method comprises the steps (a) to (d) in this order; (a) preparing adhesive film-attached semiconductor elements; (b) thermocompression-bonding the adhesive film-attached semiconductor elements to the support member so as to obtain a semiconductor part made of the adhesive film-attached semiconductor elements and the support member; (c) heating and pressurizing the semiconductor part made of the adhesive film-attached semiconductor elements and the support member using a pressurized fluid so as to proceed with curing of adhesive film; and (d) electrically connecting the adhesive film-attached semiconductor elements and the support member.

In the method of manufacturing a semiconductor device according to the invention, by conducting the step (c) of heating and pressurizing the semiconductor part after the step (b) of thermocompression-bonding the adhesive film-attached semiconductor elements to the support member, the generation of voids inside the adhesive film can be suppressed and cavities in the interfaces between the adhesive film and the semiconductor elements and in the interface between the adhesive film and the support member can be filled. This results from the fact that, since the adhesive film is not completely cured, instead, cured to the extent that the adhesive film can be softened or moved by further heating in the thermocompression bonding process (b), by performing pressurization together with heating at the same time in the pressurized curing process (c), the adhesive film can be further cured and moved so as to remove voids and fill cavities.

In the method of manufacturing a semiconductor device according to the invention, the pressurized fluid may be a pressurized gas.

In the method of manufacturing a semiconductor device according to the invention, the pressurized fluid may be pressurized air.

In the method of manufacturing a semiconductor device according to the invention, the step of heating and pressurizing the semiconductor part (c) may comprise placing the semiconductor part composed of the adhesive film-attached semiconductor elements and the support member in a pressure vessel, and heating and pressurizing the semiconductor part using the pressurized fluid.

In the method of manufacturing a semiconductor device according to the invention, the step of heating and pressurizing the semiconductor part (c) may be conducted under the condition of a heating temperature of more than or equal to 80° C. and less than or equal to 180° C., a welding pressure of more than or equal to 0.1 MPa and less than or equal to 10 MPa, and a pressurization time of more than or equal to 1 minute and less than or equal to 480 minutes.

In the method of manufacturing a semiconductor device according to the invention, before the step (a) is conducted, the adhesive film may have the viscosity of more than or equal to 10 Pa·s and less than or equal to 1000 Pa·s at the temperature of 100° C. to 150° C.

In the method of manufacturing a semiconductor device according to the invention, voids and cavities are reduced by conducting the step of heating and pressurizing the semiconductor part (c), and therefore no void with a diameter of more than or equal to 30 μm is present inside the adhesive film after the step (c) is conducted.

In the method of manufacturing a semiconductor device according to the invention, the adhesive film may include a (meth)acrylic resin.

In the method of manufacturing a semiconductor device according to the invention, the adhesive film may include a resin including a (meth)acrylic resin, wherein the (meth) acrylic resin has the amount of more than or equal to 10% and less than or equal to 50% with respect to the total amount of the resin.

In the method of manufacturing a semiconductor device according to the invention, the adhesive film may further include a thermosetting resin.

In the method of manufacturing a semiconductor device according to the invention, the (meth)acrylic resin may have the amount of more than or equal to 10 parts by mass and less than or equal to 100 parts by mass with respect to 100 parts by mass of the thermosetting resin.

In the method of manufacturing a semiconductor device according to the invention, the step of preparing the adhesive film-attached semiconductor elements (a) comprises the steps (a1) to (a3) in this order;

(a1) laminating a dicing tape-attached adhesive film over a rear surface of a wafer so that the wafer so as to the adhesive film and the dicing tape are laminated in this order;

(a2) dicing the wafer and the laminated dicing tape-attached adhesive film; and (a3) peeling the dicing tape off so as to form an adhesive film-attached semiconductor element.

There is provided a semiconductor device manufactured by the above method of the invention.

According to the invention, it is possible to obtain a method of manufacturing a semiconductor device capable of adhering semiconductor elements and a support member for mounting semiconductor elements, such as lead frames, organic substrates or the like, even in a relatively low temperature range without damaging adhesion property and workability and of suppressing the occurrence of voids. In addition, according to the invention, it is possible to obtain a semiconductor device which is manufactured by the above method of manufacturing a semiconductor device and excellent in reliability.

BRIEF DESCRIPTION OF THE DRAWINGS

The above-described objects and other objects, characteristics and advantages will become further evident with reference to the preferable embodiments described below and the accompanying drawings below.

BEST MODE FOR CARRYING OUT THE INVENTION

Hereinafter, the method of manufacturing a semiconductor device and the semiconductor device according to the invention will be described. A method of the present invention relates to the method of manufacturing a semiconductor device comprising a semiconductor element and a support member adhered to the semiconductor element through a cured material of an adhesive film, wherein the method comprises the steps (a) to (d) in this order; (a) preparing adhesive film-attached semiconductor elements; (b) thermocompression-bonding the adhesive film-attached semiconductor elements to the support member so as to obtain a semiconductor part made of the adhesive film-attached semiconductor elements and the support member; (c) heating and pressurizing the semiconductor part made of the adhesive film-attached semiconductor elements and the support member using a pressurized fluid so as to proceed with curing of adhesive film; and (d) electrically connecting the adhesive film-attached semiconductor elements and the support member.

According to the present invention, it is possible to obtain a method of manufacturing a semiconductor device capable of adhering semiconductor elements and a support member for mounting semiconductor elements, such as lead frames, organic substrates or the like, even in a relatively low temperature range, such as below 150° C., without damaging adhesion property and workability and of suppressing the occurrence of voids. In addition, the semiconductor device according to the invention is characterized by being manufactured by the above method of manufacturing. Thereby, it is possible to obtain a semiconductor device which is excellent in reliability. Hereinafter, the invention will be described in detail.

The method of manufacturing a semiconductor device according to the invention includes the process of preparing adhesive film-attached semiconductor elements (a). The process of preparing adhesive film-attached semiconductor elements is not particularly limited and can include, for example, a method of adhering an adhesive film on the rear surface of a divided semiconductor element, and a method of applying an adhesive film on the rear surface of a wafer in a uniform thickness using a spin coater or the like and then dicing a semiconductor element, but, from the viewpoint of complication of the processes, a method comprising the steps of (a1) to (a3) shown below in this order is more preferable.

(a1) laminating a dicing tape-attached adhesive film over a rear surface of a wafer so that the wafer so as to the adhesive film and the dicing tape are laminated in this order;

(a2) dicing the wafer and the laminated dicing tape-attached adhesive film; and (a3) peeling the dicing tape off so as to form an adhesive film-attached semiconductor element.

Figure 1:
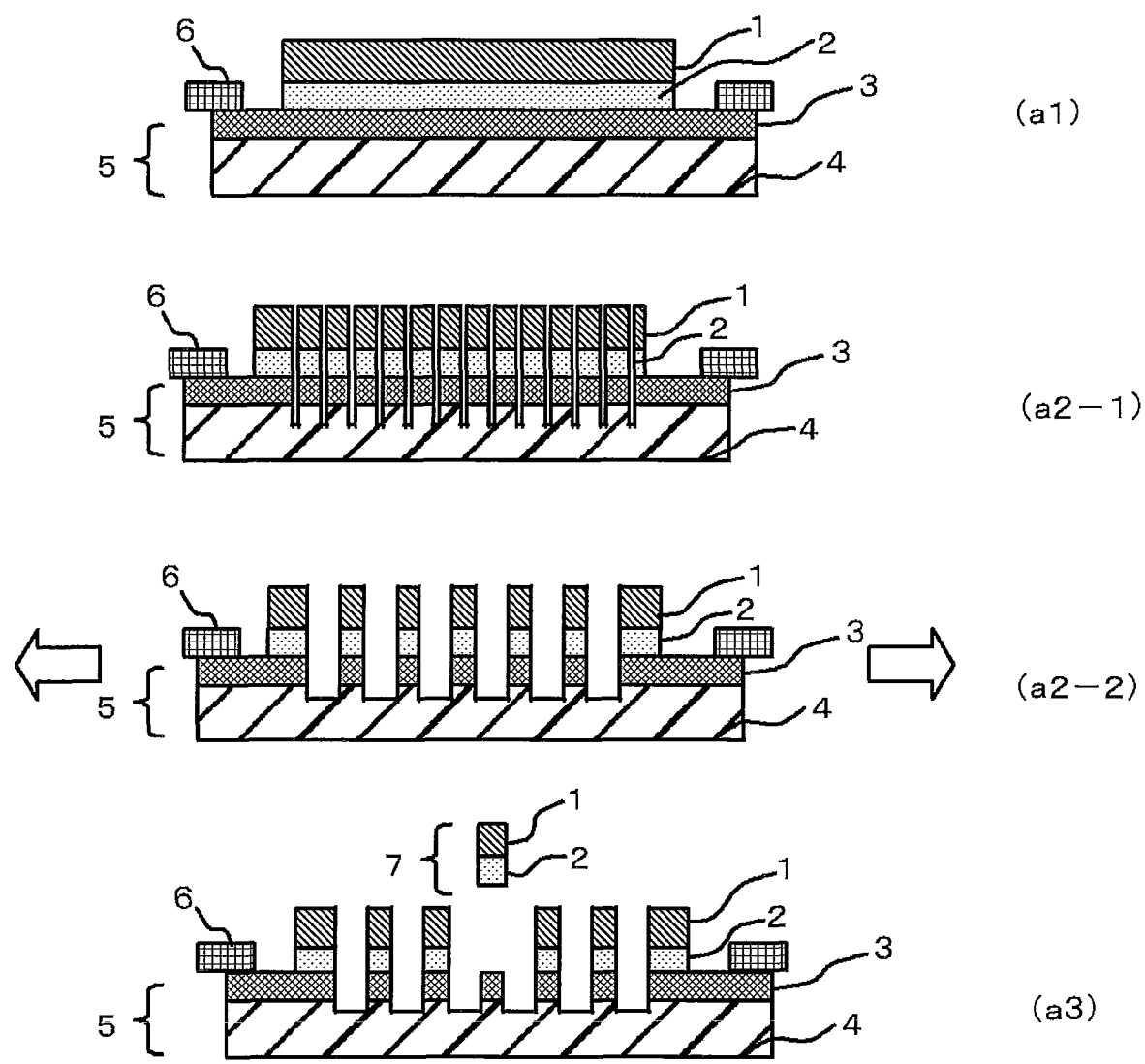
FIG. 1 is a cross-sectional view showing an example of the process of preparing an adhesive film-attached semiconductor element.

Although a cross-sectional view explaining an example of the process of preparing adhesive film-attached semiconductor elements is shown in FIG. 1, the details thereof will be described below.

The method of manufacturing a semiconductor device according to the invention includes the process of thermocompression-bonding the adhesive film-attached semiconductor elements to the support member so as to obtain a semiconductor part made of the adhesive film-attached semiconductor elements and the support member (a). In the thermocompression bonding process, a conventional chip mounter or the like are used, and examples of the thermocompression bonding process include a method of placing the support member on a hot plate and then pressing it with the adhesive film-attached semiconductor element, a method of transferring heat through a pressing jig while pressing the adhesive film-attached semiconductor element on the support member, or the combination thereof, or the like. The temperature condition of the thermocompression bonding process is not particularly limited, but are preferably from more than or equal to 60° C. and less than or equal to 180° C., and more preferably from more than or equal to 80° C. and less than or equal to 150° C. By performing the thermocompression-bonding process at a temperature more than or equal to the above mentioned lower limit, the adhesion film-attached semiconductor element and the support member are sufficiently adhered, and thus the separation of the adhesion film-attached semiconductor element is suppressed during transportation. In addition, by performing thermocompression-bonding at a temperature less than or equal to the above mentioned upper limit, the warpage of the support member and the adhesion film-attached semiconductor element is suppressed, and therefore adhesion is enabled without deviating from adhesion positions. Furthermore, by performing thermocompression-bonding process at a temperature less than or equal to the above mentioned upper limit, the curing of the adhesive film is suppressed, and therefore the adhesive film can be moved by heating and pressurizing in the pressurized curing process (c) so as to remove voids and fill cavities. In addition, the time condition of the thermocompression is not particularly limited, but is preferably from more than or equal to 0.1 seconds and less than or equal to 60 seconds, and more preferably from more than or equal to 0.5 seconds and less than or equal to 5 seconds. By performing thermocompression-bonding process at a time more than or equal to the above mentioned lower limit, the adhesion film-attached semiconductor element and the support member are sufficiently adhered, and thus the separation of the adhesion film-attached semiconductor element is suppressed during the transportation. In addition, by performing the thermocompression-bonding process at a time less than or equal to the above upper limit, the curing of the adhesive film is suppressed, and therefore the adhesive film can be moved by heating and pressurizing in the pressurized curing process (c) so as to remove voids and fill cavities. In addition, the pressure condition of thermocompression is not particularly limited, but is preferably from more than or equal to 1 kPa and less than or equal to 1 MPa, and more preferably from more than or equal to 3 kPa and less than or equal to 0.5 MPa. By performing thermocompression-bonding process at a pressure less than or equal to the above mentioned upper limit, fracture of the semiconductor element is suppressed. In addition, by performing the thermocompression-bonding process at a pressure more than or equal to the above mentioned lower limit, the adhesion film-attached semiconductor element and the support member are sufficiently adhered, and thus the separation of the adhesion film-attached semiconductor element is suppressed during transportation. Further, the support member used in the invention may also include organic substrates, such as a bismaleimide triazine substrate or a polyimide substrate, and members having semiconductor elements, spacers or the like stacked in one or more layers on the organic substrate.

The method of manufacturing a semiconductor device according to the invention includes the process of heating and pressurizing the semiconductor part made of the adhesive film-attached semiconductor elements and the support member using a pressurized fluid so as to proceed with curing of adhesive film. In the method of manufacturing a semiconductor device according to the invention, by conducting the process of heating and pressurizing the semiconductor part (c) after the process of thermocompression-bonding the adhesive film-attached semiconductor elements to the support member (b), the generation of voids inside the adhesive film can be suppressed and cavities in the interfaces between the adhesive film and the semiconductor elements and in the interface between the adhesive film and the support member can be filled. This results from the fact that, since the adhesive film is not completely cured, instead, cured to the extent that the adhesive film can be softened or moved by further heating in the thermocompression bonding process (b), by performing pressurization together with heating at the same time in the pressurized curing process (c), the adhesive film can be further cured and moved so as to remove voids and fill cavities.

Figure 2:
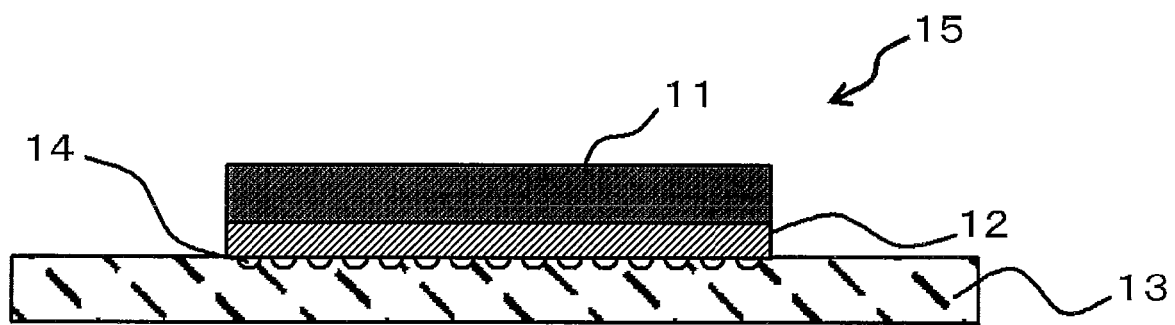
FIG. 2 is a cross-sectional view showing an example of the state of the semiconductor device after the thermocompression bonding process.
Figure 3:
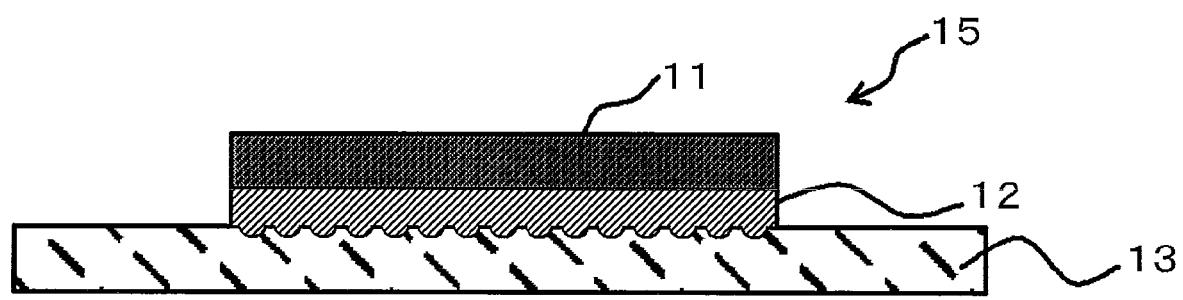
FIG. 3 is a cross-sectional view showing an example of the state of the semiconductor device after the pressurized curing process.

FIG. 2 shows a cross-sectional view explaining an example of the state of the semiconductor device after the thermocompression bonding process (b) and FIG. 3 shows a cross-sectional view explaining an example of the state of the semiconductor device after the pressurized curing process (c). As shown in FIG. 2, for example, in a case in which the support member is a substrate 13 made of an organic material having a circuit, since the circuit-derived protrusions and recessions are present on the surface of the substrate 13, which is to be a surface to be adhered, cavities 14 are liable to remain in the interface between the adhesive film 12 of the adhesive film 12-attached semiconductor element 11 and the substrate 13, but, by performing the pressurized curing process (c), as shown in FIG. 3, it is possible to fill the cavities 14 even when the protrusions and recessions are present on the surface of the substrate 13, which is a surface to be adhered.

Furthermore, the voids inside the adhesive film and the cavities in the interfaces between the adhesive film and the semiconductor elements and in the interface between the adhesive film and the support member include not only cavities in the interface between the adhesive film and the support member, which have not been completely filled in the thermocompression bonding process or cavities attributed to gas generated from the adhesive film by heating, but also cavities attributed to gas generated from the organic substrate of the support member. In the case of trying to fill cavities in the interfaces between the adhesive film and the support member using only the thermocompression bonding process (b), without performing the pressurized curing process (c), a method can be considered in which the cavities in the interface are completely filled in the thermocompression bonding process (b) using an adhesive film with a lower viscosity, and, furthermore, the curing of the adhesive film is made to proceed by performing only a heating treatment, but, in this case, it is considered that voids or cavities attributed to gas generated from the organic substrate of the support member are markedly regenerated, and therefore, it is considered that, for example, it is necessary to add a process or the like that dries the support member so as to remove absorbed moisture in the support member immediately before the thermocompression bonding process (b). On the other hand, according to the method of manufacturing a semiconductor device according to the invention, it is possible to suppress the generation of voids inside the adhesive film and to fill cavities in the interfaces between the adhesive film and the semiconductor elements and in the interface between the adhesive film and the support member without additional process of drying the support member so as to remove absorbed moisture in the support member immediately before the thermocompression bonding process (b). In addition, by performing heating and pressurization using a pressurized fluid, and not using pressing or the like, it is possible to apply pressure to the semiconductor part made of the adhesive film-attached semiconductor elements and the support member uniformly from all directions; therefore it is possible to prevent the adhesive film from bleeding to the peripheries of the semiconductor elements.

The pressurized fluid used in the pressurized curing process (c) refers to a fluid used for pressurization, and such a fluid is not particularly limited, but a gas, such as nitrogen gas, argon gas, air or the like, is preferable. Thereby, it is possible to suppress the effect on the adhesive film-attached semiconductor elements or the support member, compared with the case of using a liquid. In addition, from the viewpoint of the fact that a semiconductor device can be manufactured at a lower cost than a case in which nitrogen gas, argon gas or the like is used, among the above gases, air is preferable.

In the pressurized curing process (c), a method of heating and pressurizing with the pressurized fluid is not particularly limited, but it is preferable to heat and pressurize using a pressure vessel. By using a pressure vessel, it is possible to uniformly apply pressure to the adhesive film, and to suppress the generation of voids inside the adhesive film and fill cavities in the interfaces between the adhesive film and the semiconductor elements and in the interface between the adhesive film and the support member with no bleeding. Specifically, a method can be used in which the semiconductor part made of the adhesive film-attached semiconductor elements and the support member is placed in the pressure vessel, and heating and pressurizing are performed by a pressurized fluid.

Figure 4:
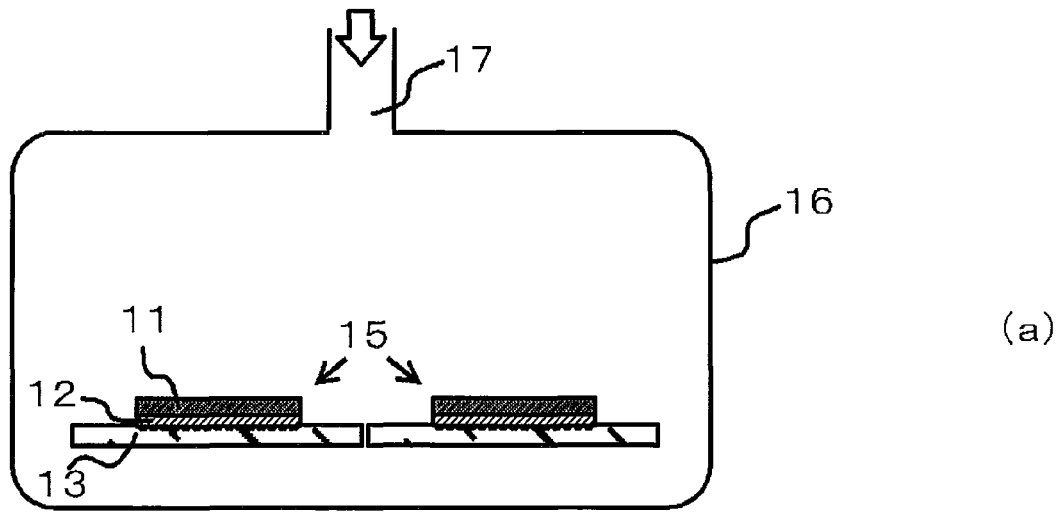
FIG. 4 is a cross-sectional view showing an example of the state in which an adhesive film-attached semiconductor element and a support member are placed in a pressure vessel.
Figure 4:
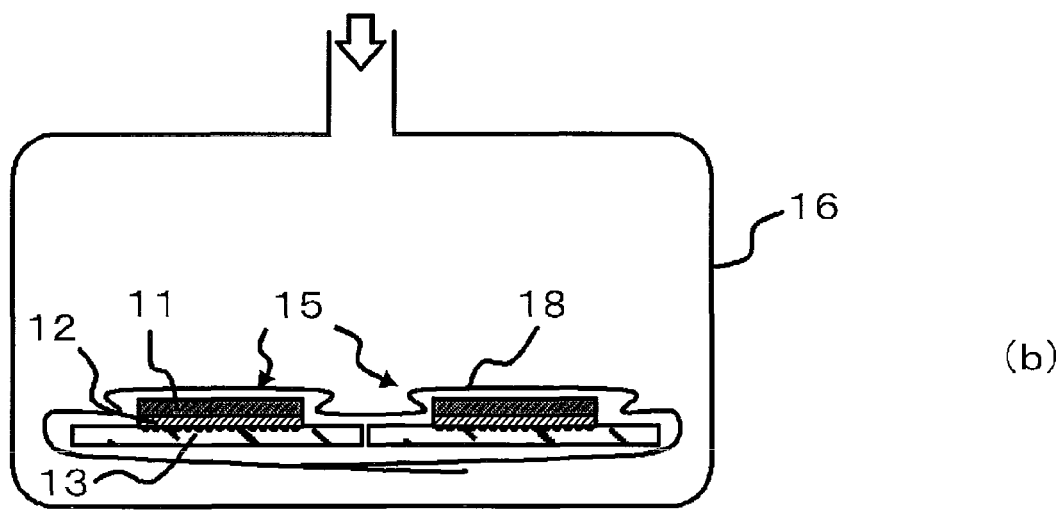
Figure 4:
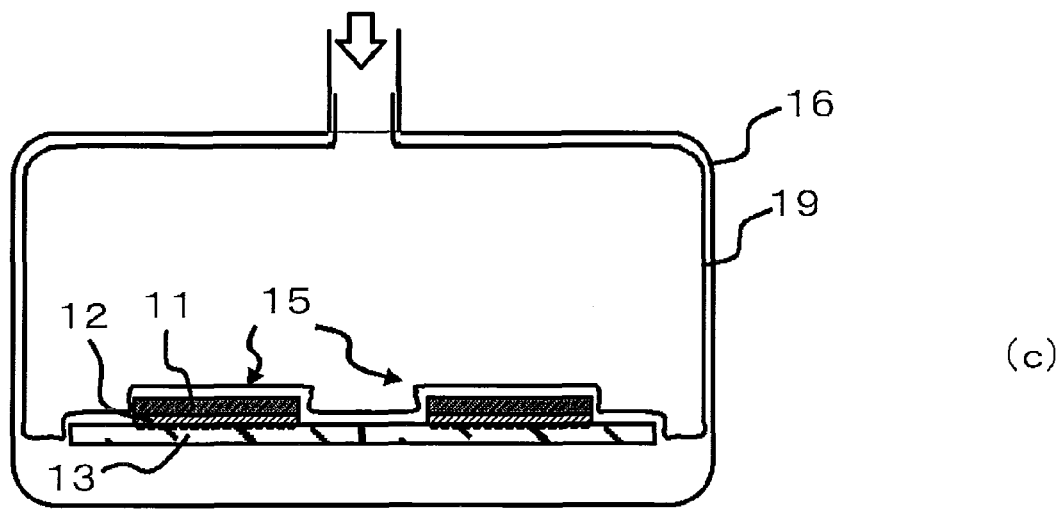

More specific examples of the method of directly heating and pressurizing with a pressurized fluid include, as shown in FIG. 4, (i) a method placing a semiconductor part 15 made of adhesive film 12-attached semiconductor elements 11 and a substrate 13 (support member) in a pressure vessel 16, then introducing a pressurized fluid into the pressure vessel 16 from a pressurized fluid inlet 17 and heating the pressure vessel if necessary (FIG. 4(a)) (ii) a method of placing a semiconductor part 15 made of adhesive film 12-attached semiconductor elements 11 and a substrate 13 (support member) in a pressure vessel 16, and, placing a cover film 18 so as to cover the semiconductor part 15, then introducing a pressurized fluid in from the cover film 18 of the pressure vessel 16 and heating the pressure vessel 16 if necessary (FIG. 4(b)), (iii) a method of placing a semiconductor part 15 made of adhesive film 12-attached semiconductor elements 11 and a substrate 13 (support member) in a pressure vessel 16, and, furthermore, placing a saclike film 19 so as to be able to press the semiconductor element 15 from the top, then introducing a pressurized fluid into the saclike film 19 in the pressure vessel 16 and heating the pressure vessel 16 if necessary (FIG. 4(c)) or the like.

In addition, the method of placing the semiconductor part made of the adhesive film-attached semiconductor elements and the support member in the pressure vessel is not particularly limited, and examples thereof include a method of aligning a plurality of large-scale substrates with a plurality of semiconductor elements arranged in a matrix format, as is a MAP method, on them with gaps provided therebetween, or the like. Furthermore, in the above method (i), by aligning a plurality of substrate storage magazines or the like including a plurality of large-scale substrates with gaps provided therebetween, it is possible to apply pressure uniformly to all the adhesive films even when pressurized curing is performed on a number of large-scale substrates at one time. From such a standpoint, it is desirable to use the method (i).

The heating condition in the pressured curing process (c) is not particularly limited, but is preferably from more than or equal to 80° C. and less than or equal to 180° C., and more preferably from more than or equal to 100° C. and less than or equal to 150° C. By performing the process at more than or equal to the lower limit, the curing of the adhesive film proceeds rapidly, and therefore the pressurized curing process (c) can be shortened. In addition, by performing the process at less than or equal to the upper limit, it is possible to suppress the regeneration of cavities in the interface between the adhesive film and the support member caused by outgassing from the adhesive film and outgassing from the support member.

The pressurization condition in the pressured curing process (c) is not particularly limited, but is preferably from more than or equal to 0.1 MPa and less than or equal to 10 MPa, and more preferably from more than or equal to 0.2 MPa and less than or equal to 2 MPa. By performing the process at more than or equal to the lower limit, it is possible to suppress the generation of voids inside the adhesive film and fill cavities in the interfaces between the adhesive film and the semiconductor elements and in the interface between the adhesive film and the support member, and, by performing the process at less than or equal to the upper limit, it is possible to prevent the breakage of the semiconductor element in the pressurized curing process (c).

The pressurization time in the pressured curing process (c) is not particularly limited, but is preferably from more than or equal to 1 minute and less than or equal to 480 minutes, and more preferably from more than or equal to 3 minutes and less than or equal to 240 minutes. By performing the process at a pressurization time of more than or equal to the lower limit, the adhesive film is cured, and stabilized connection can be performed in the process of electrically connecting the semiconductor elements and the support member (d). In addition, by performing the process at less than or equal to the upper limit, it is possible to prevent the adhesive film from being excessively cured and to prevent the support member from being warped.

In the method of manufacturing a semiconductor device according to the invention, it is preferable that voids with a diameter of more than or equal to 30 μm, more preferably voids with a diameter of more than or equal to 10 μm, are not present inside the adhesive film after performing the pressurized curing process (c). By including no void with a diameter of more than or equal to 30 μm, it becomes difficult for the interface to be peeled off while at a high temperature, and the sufficient reflow resistance of the semiconductor device according to the invention can be maintained.

Figure 5:
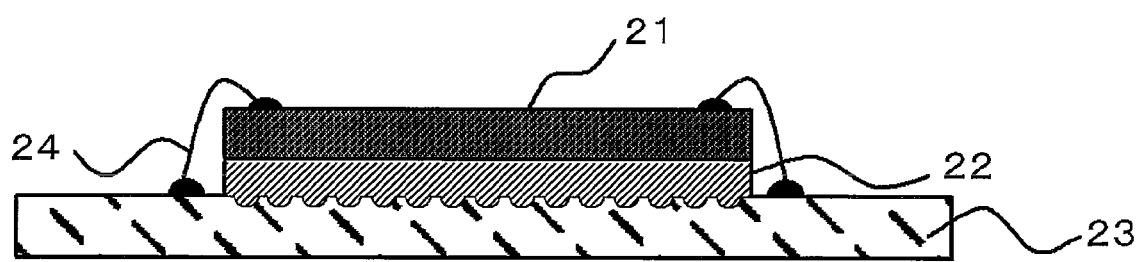
FIG. 5 is a cross-sectional view explaining an example of the state after the wire bonding process.

The method of manufacturing a semiconductor device according to the invention includes the process of electrically connecting the semiconductor elements and the support member (d). As shown in FIG. 5, as a method of electrically connecting an adhesive film 22-attached semiconductor element 21 with a substrate 23 (support member), a wire bonding method that performs connection using a bonding wire 24 is widely used. Further, the curing of the adhesive film may be made to further proceed by the process (d).

Figure 6:
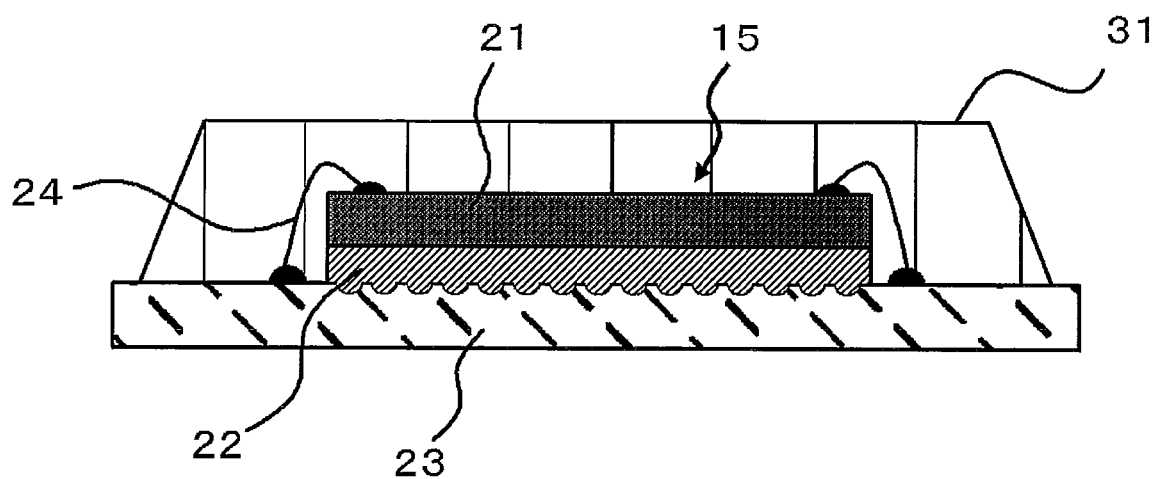
FIG. 6 is a cross-sectional view explaining an example of the state of the semiconductor device after the encapsulating process.

The method of manufacturing a semiconductor device according to the invention is not particularly limited, and, as shown in FIG. 6, after performing the above processes (a) to (d), may mold and cure a resin composition for encapsulating semiconductors with a molding method, such as a transfer mold, a compression mold, an injection mold or the like on one surface on which the semiconductor element 21 of a semiconductor part 15 made of the adhesive film 22-attached semiconductor element 21 and the substrate 23 (support member) is mounted, thereby encapsulating and protecting the semiconductor element 21 and the electrical joining area with a encapsulating material 31.

Furthermore, the semiconductor device in which semiconductor elements or the like are encapsulated with the cured material of a resin composition for encapsulating semiconductors can be mounted in an electronic apparatus as it is or after completely curing the resin composition for encapsulating semiconductors at a temperature of about from 80° C. to 200° C. for about from 10 minutes to 10 hours as a post-curing. Further, the curing of the adhesive film may be made to further proceed by the molding process and the post-curing process of the resin for encapsulating semiconductors. Further, in a case in which the semiconductor part made of the adhesive film-attached semiconductor element and the support member takes a MAP method in which a plurality of semiconductor elements are aligned in a matrix format on a large-scale substrate, it is possible to dice into individual packages after entirely molding and encapsulating one surface on which the semiconductor elements are mounted with the resin composition for encapsulating semiconductors.

Next the details of a method that manufactures a semiconductor device using an adhesive film will be described with an example according to the process flow.

As shown in FIG. 1A, a dicing tape-attached adhesive film is laminated on the rear surface of a wafer 1 so that the wafer 1, the adhesive film 2, an adhesive layer 3 of the dicing tape 5 and a substrate film 4 of the dicing tape 5 are laminated in this order, and fixed on a dicing table, not shown, with wafer rings 6. Next, the wafer 1 and the dicing tape 5-attached adhesive film 2 laminated are integrally diced so as to divide a semiconductor element 11 ((a2-1) in FIG. 1).

Next, the dicing tape 5 is expanded by an expansion device, not shown, so as to break up the diced semiconductor element 11 at uniform intervals ((a2-2) in FIG. 1), then the adhesive film-attached semiconductor element 7 peeled off from the dicing tape 5 is picked up ((a3) in FIG. 1) and thermocompression-bonded on a substrate 13, thereby obtaining a semiconductor part 15 (FIG. 2). As the substrate 13, for example, a substrate having an epoxy resin impregnated in a glass fiber, a polyimide substrate, a bismaleimide triazine resin substrate or the like may be used.

Next, after pressurized curing is performed on the obtained semiconductor part 15 in a pressure vessel 16 ((i) in FIG. 4), a semiconductor element 21 and a substrate 23 (support member) are electrically combined by wire bonding (FIG. 5) and encapsulating or the like of the semiconductor part 15 is performed by a encapsulating material 31 (FIG. 6).

Thus far, an embodiment of the invention has been described with reference to the accompanying drawings, but this is merely an example of the invention, and thus a variety of configurations other than the above can be employed.

Next, the adhesive film used in the method of manufacturing a semiconductor device according to the invention will be described.

The adhesive film used in the method of manufacturing a semiconductor device according to the invention preferably has a melt viscosity at from 100° C. to 150° C. of more than or equal to 10 Pa·s, and more preferably of more than or equal to 50 Pa·s before performing the process (a). Thereby, it is possible to suppress the squeezing-out of the adhesive film to the peripheries of the semiconductor elements in the thermocompression bonding process (b). On the other hand, the adhesive film preferably has a melt viscosity of less than or equal to 1000 Pa·s at from 100° C. to 150° C., more preferably of less than or equal to 500 Pa·s, and particularly preferably less than or equal to 350 Pa·s before performing the process (a). Thereby, the adhesive film can be moved by heating and pressurizing in the pressurized curing process (c) so as to remove voids and fill cavities.

The melt viscosity in the invention can be measured by giving a shear stress with a frequency of 1 Hz at a rate of temperature increase of 10° C./minute to a sample in a film state using a rheometer which is a viscoelasticity measuring device. In addition, the melt viscosity in the invention indicates the property of a solution, which differs from dynamic viscoelasticity.

Next, each component of the resin composition constituting the adhesive film will be described. Here, each component may be a single compound or a combination of multiple compounds.

The resin composition constituting the adhesive film according to the invention is not particularly limited, but is preferably a (meth)acrylic resin. A (meth)acrylic resin is a copolymer of (meth)acrylic acid ester and other monomers, and preferably includes (meth)acrylic acid and derivatives thereof as the main monomers.

Examples of (meth)acrylic acid ester include acrylic acid esters, such as methyl acrylate, ethyl acrylate or the like, and methacrylic acid esters, such as methyl methacrylate, ethyl methacrylate or the like. In addition, examples of the other monomers include acrylic acid, methacrylic acid, acrylonitrile, acrylamide or the like.

Since a (meth)acrylic resin has a low glass transition temperature, it is possible to improve the initial adhesiveness by mixing a (meth)acrylic resin in a resin composition. Here, the initial adhesiveness refers to the adhesiveness when an adhesive film is adhered to a semiconductor element, and particularly, to the adhesiveness to the rear surface of a wafer when the semiconductor element is in a wafer state.

In addition, the (meth)acrylic resin is preferably a (meth)acrylic acid ester copolymer including epoxy groups, hydroxyl groups, carboxyl groups, nitrile groups or the like. Thereby, the adhesiveness to an object to be adhered, such as the rear surface of a semiconductor element, a support member and the like can be improved. Specific examples of compounds including such a functional group include glycidyl (meth)acrylate including glycidyl ether groups, hydroxyl (meth)acrylate including hydroxyl groups, carboxy (meth)acrylate including carboxylic groups, (meth)acrylonitrile including nitrile groups or the like.

Among them, in particular, it is preferable to use a (meth)acrylic acid ester copolymer including monomer units having carboxyl groups. Thereby, the curing of the adhesive film is further promoted, and therefore it is possible to strongly adhere the film to an object to be adhered within a short time of the pressurized curing process (c).

From the viewpoint of strongly adhering the film to an object to be adhered within the short time of the pressurized curing process (c), the content of the (meth)acrylic acid ester copolymer including monomer units having carboxyl groups is preferably, for example, more than or equal to 0.5% by mass, and more preferably more than or equal to 1% by mass with respect to the total amount of the (meth)acrylic resin. In addition, from the viewpoint of further improving the storage stability of the adhesive film, the content of compounds including carboxyl groups is preferably, for example, less than or equal to 10% by mass, and more preferably less than or equal to 5% by mass with respect to the total amount of the (meth)acrylic resin.

The weight-average molecular weight of the (meth)acrylic resin is preferably set to, for example, more than or equal to 100,000 and less than or equal to 1,300,000, and more preferably more than or equal to 150,000 and less than or equal to 1,000,000. By setting to more than or equal to the above lower limit, the film-forming property of the adhesive film can be further improved, and by setting to less than or equal to the above upper limit, it is possible to ensure the fluidity during adhesion.

The content of the (meth)acrylic resin with respect to the entire resin is preferably more than or equal to 10%, and more preferably more than or equal to 25%. Thereby, the adhesiveness can be improved. The content of the (meth)acrylic resin with respect to the entire resin is preferably less than or equal to 50%, and more preferably less than or equal to 40%. Thereby, the workability can be improved.

The weight-average molecular weight of the (meth)acrylic resin can be measured by Gel Permeation Chromatography (GPC). Examples of the measurement conditions include a high speed GPC SC-8020 apparatus (manufactured by Tosho Corporation), columns of TSK-GEL GMH XL-L, a temperature of 40° C., a solvent of tetrahydrofuran or the like.

From the viewpoint of suppressing the adhesion of the adhesive film from being too strong, thereby improving the workability, the glass transition temperature of the (meth)acrylic resin is preferably, for example, more than or equal to 0° C., and more preferably more than or equal to 5° C. In addition, from the viewpoint of further improving the adhesiveness at a low temperature, the glass transition temperature of the acrylic resin is preferably, for example, less than or equal to 30° C., and more preferably less than or equal to 20° C.

The glass transition temperature of the (meth)acrylic resin can be measured using, for example, a thermomechanical analyzer (TMA/SS6100, manufactured by Seiko Instrument Inc.) from the inflection point when the resin is extended with a predetermined load (10 mN) while raising the temperature from −65° C. at a rate of temperature increase of 5° C./minute.

The resin composition constituting the adhesive film according to the invention is not particularly limited, but preferably includes a thermosetting resin, and particularly preferably an epoxy resin.

The epoxy resin refers to any of a monomer, an oligomer and a polymer including epoxy groups. Specific examples of the epoxy resin include novolak-type epoxy resins, such as a phenol novolak-type epoxy resin, a cresol novolak-type epoxy resin or the like; bisphenol-type epoxy resins, such as a bisphenol A-type epoxy resin, a bisphenol F-type epoxy resin or the like; hydroquinone-type epoxy resins; biphenyl-type epoxy resins; stilbene-type epoxy resins; triphenol methane-type epoxy resins; triazine nucleus-containing epoxy resin; dicyclopentadiene-modified phenol-type epoxy resins; aralkyl-type epoxy resins, such as a naphthol-type epoxy resin, phenol aralkyl-type epoxy resins having phenylene and/or biphenylene skeletons, and naphthol aralkyl-type epoxy resins having phenylene and/or biphenylene skeletons; or the like.

Among them, novolak-type epoxy resins, aralkyl-type epoxy resins or the like are preferably used. Since, by using an aralkyl-type epoxy resin, variation in the complex viscosity |C*| of the adhesive film can be uniformly suppressed to the vicinity of from 100° C. to 150° C. in the thermocompression bonding process (b), and alteration in the flow amount of the adhesive film in a temperature range of from 100° C. to 150° C. which is a general thermocompression bonding temperature can be suppressed. In addition, by using a novolak-type epoxy resin, it is possible to increase the glass transition temperature after the curing of the adhesive film, and also it is possible to improve adhesiveness between the adhesive film and an object to be adhered.

The content of the (meth)acrylic resin with respect to 100 parts by mass of a thermosetting resin is preferably more than or equal to 10 parts by mass, and more preferably more than or equal to 30 parts by mass. Thereby, the workability of the adhesive film can be improved. In addition, the content of the (meth)acrylic resin with respect to 100 parts by mass of a thermosetting resin is preferably less than or equal to 100 parts by mass, and more preferably less than or equal to 80 parts by mass.

The content of the epoxy resin is not particularly limited, but is preferably more than or equal to 100 parts by mass and less than or equal to 1000 parts by mass, and particularly preferably more than or equal to 200 parts by mass and less than or equal to 500 parts by mass with respect to 100 parts by mass of a (meth)acrylic acid ester copolymer. With the content in the above range, it is possible to satisfy both a low linear expansion coefficient and toughness after curing of the adhesive film. The content is more preferably less than or equal to 350 parts by mass. Thereby, it is possible to further satisfy both a low linear expansion coefficient and toughness after the curing of the adhesive film.

The content of the aralkyl-type epoxy resin is not particularly limited, but is preferably from 30 parts by mass to 80 parts by mass, and particularly preferably from 40 parts by mass to 70 parts by mass with respect to the entire epoxy resin. Since, with the content in the above range, variation in the complex viscosity |C*| of the adhesive film can be uniformly suppressed in the vicinity of from 100° C. to 150° C., which are temperatures in which general semiconductor elements are thermocompression-bonded, alteration in the flow amount of the adhesive film can be suppressed, and, furthermore, the glass transition temperature after the curing of the adhesive film can be increased.

The softening point of the epoxy resin is not particularly limited as long as the epoxy resin is compatible with a (meth) acrylic resin, but is preferably more than or equal to 40° C. and less than or equal to 100° C., and particularly preferably more than or equal to 50° C. and less than or equal to 90° C. Since, with a softening point of more than or equal to the above lower limit, the tackiness of the adhesive film can be reduced, the property of an adhesive film-attached semiconductor element being peeled off from a dicing tape is improved after the dividing of a wafer by dicing, and the pickup property can be improved. In addition, with the softening point of less than or equal to the above upper limit, a rise in the melt viscosity before the pressurized curing process (c) can be suppressed.

In addition, as the epoxy resin, a combination of a plurality of epoxy resins with different softening points may be used. Thereby, there are advantages in that both the effect of reducing the tackiness of the adhesive film and the effect of suppressing a rise in the melt viscosity before the pressurized curing process (c) can be more easily satisfied. Examples of the combination of a plurality of epoxy resins with different softening points include a combination of an epoxy resin with a softening point of more than or equal to 40° C. and less than 70° C. and an epoxy resin with a softening point of more than or equal to 70° C. and less than or equal to 100° C.

The resin composition constituting the adhesive film according to the invention is not particularly limited, but preferably includes a curing agent. The curing agent may be appropriately selected and used as long as it serves as the curing agent of an epoxy resin. Specific examples of the curing agent include amine-based curing agents, such as aliphatic polyamines, such as diethylene triamine, triethylene tetramine, meta-xylylene diamine or the like, aromatic polyamines, such as diaminodiphenylmethane, m-phenylenediamine, diaminodiphenylsulfone or the like, polyamine compounds containing dicyandiamide, organic acid dihydrazide or the like; acid anhydride-based curing agents, such as aliphatic acid anhydrides, such as hexahydrophthalic acid anhydride, methyltetrahydrophthalic acid anhydride or the like, aromatic acid anhydrides, such as trimellitic anhyride, anhydrous pyromellitic acid, benzophenon tetracarboxylic acid or the like, phenol-based curing agents, such as a phenolnovolak resin, a cresol novolak resin, a phenol aralkyl resin (including phenylene, biphenylene skeletons), a naphtholaralkyl (including phenylene, biphenylene skeletons) resin, a triphenole methane resin, a dicylopentadiene-type phenol resin, bis(mono or di t-butylphenol)propane, methylenebis(2-propenyl)phenol, propylenebis(2-propenyl) phenol, bis[(2-propenyloxy)phenyl]methan, bis[(2-propenyloxy)phenyl]propane, 4,4'-(1-methylethylidene)bis[(2-(2-propenyl)phenol], 4,4'-(1-methylethylidene)bis[(2-(1-phenylethyl)phenol], 4,4'-(1-methylethylidene)bis[2-methyl-6-hydroxymethylphenol], 4,4'-(1-methylethylidene)bis[2-methyl-6-(2-propenyl)phenol], 4,4'-(1-methyltetradecylidyne)bisphenol or the like.

The content of the curing agent in the resin composition constituting the adhesive film used in the invention can be obtained by calculating the equivalent ratio between the epoxy equivalent weight of the epoxy resin and the curing agent. In a case in which the curing agent is a phenol resin, the equivalent ratio between the epoxy equivalent weight of the epoxy resin and the functional groups in the curing agent is preferably more than or equal to 0.5 and less than or equal to 1.5, and particularly preferably more than or equal to 0.7 and less than or equal to 1.3. With the content of the curing agent in the above range, it is possible to satisfy both the heat resistance and storage stability of the adhesive film.

The curing agent is preferably a liquid-phase curing agent with a viscosity at 25° C. of less than or equal to 30 Pa·s (30,000 cps), and, furthermore, more preferably a liquid-phase curing agent with a viscosity at 25° C. of less than or equal to 10 Pa·s (10,000 cps). With a viscosity of the curing agent at 25° C. of less than or equal to the above-defined value, the initial adhesiveness of the adhesive film or the reliability of a semiconductor device is improved.

The content of the liquid-phase curing agent with a viscosity at 25° C. of less than or equal to 30 Pa·s (30,000 cps) is not particularly limited, but is preferably from 30% by mass to 80% by mass, and particularly preferably from 40% by mass to 70% by mass with respect to the entire curing agent. With a content of the curing agent of more than or equal to the above lower limit, a rise in the melt viscosity before the pressured curing process (c) can be suppressed, and, with a content of the curing agent of less than or equal to the above upper limit, the tackiness of the adhesive film can be reduced, and therefore it is possible to improve the workability.

Examples of the liquid-phase curing agent with a viscosity at 25° C. of less than or equal to 30 Pa·s (30,000 cps) include liquid-phase phenol compounds. Specific examples thereof include bis(mono or di t-butylphenol) propane, methylene bis(2-propenyl)phenol, propylene bis(2-propenyl)phenol, bis [(2-propenyloxy)phenyl]methane, bis[(2-propenyloxy)phenyl]propane, 4,4'-(1-methylethylidene)bis[2-(2-propenyl) phenol], 4,4'-(1-methylethylidene)bis[2-(1-phenylethyl) phenol, 4,4'-(1-methylethylidene)bis[2-methyl-6-hydroxymethylphenol], 4,4'-(1-methylethylidene)bis[2-methyl-6-(2-propenyl)phenol], 4,4'-(1-methyltetradecylidyne)bis phenol. The viscosity of these liquid-phase compounds can be controlled by the number of nuclei n or the kind of benzene ring substituent groups.

As the curing agent, it is also possible to add and concurrently use a solid-form phenol resin with the liquid-phase phenol compound. The "solid-form" means that a resin remains in a solid state at 25° C. and a normal pressure. By concurrently using a solid-form phenol resin, it is possible to reduce the tackiness of an adhesive film for a semiconductor at room temperature and to improve workability. In addition, the solid-form phenol resin refers to all of monomers, oligomers and polymers having at least two or more phenolic hydroxyl groups which can curing-react with the epoxy resin so as to form a cross-lined structure, and examples thereof include a phenol novolak resin, a cresol novolak resin, a phenol aralkyl (including phenylene and biphenylene skeletons) resin, a naphtholaralkyl (including phenylene, biphenylene skeletons) resin, a triphenol methane resin, a dicyclopentadiene-type phenol resin or the like. Not only a singular number but also a plural number of the solid-form phenol resins may be used.

The content of the solid-form phenol resin is not particularly limited, but the ratio of the epoxy equivalent of the epoxy resin to the combined equivalent weight of the functional groups in the liquid-phase phenol compound and the solid-form phenol resin is preferably more than or equal to 0.5 and less than or equal to 1.5, and particularly preferably more than or equal to 0.7 and less than or equal to 1.3. With the content in the above range, both the heat resistance and storage stability of the adhesive film can be satisfied.

The content of the (meth)acrylic resin is not particularly limited, but is preferably less than the total mixing amount of the epoxy resin and the curing agent. With such a content, the generation of outgas exhausted from the adhesive film when the adhesive film is heated in the pressurized curing process (c) can be effectively suppressed, and therefore it is possible to achieve prevention of the contamination of an object to be adhered by the outgas and the improvement in the adhesiveness between the adhesive film and an object to be adhered.

The resin composition constituting the adhesive film according to the invention may include a curing accelerator. It is possible to appropriately select and use any curing accelerator as long as the accelerator accelerates a curing reaction between the epoxy resin and the curing agent. Specific examples of the curing accelerator include amine-based catalysts, such as imidazoles, 1,-8-diazabicyclo-(5,-4,-0) undecene or the like; and phosphorous compounds, such as molecular compounds or the like of triphenylphosphine or tetra-substituted phosphonium and a multifunctional phenol compound. Among them, preferred are phosphorous compounds satisfying both the rapid curing property of the adhesive film and the corrosiveness of an aluminum pad on a semiconductor element.

The content of the curing accelerator is preferably from 0.01 parts by mass to 10 parts by mass, and particularly preferably from 0.1 parts by mass to 5 parts by mass with respect to a total of 100 parts by mass of the epoxy resin and the curing agent. With the content in the above range, it is possible to maintain the rapid curing property and storage stability of the adhesive film and the balance in properties after curing.

Among phosphorous compounds, particularly preferred are molecular compounds of tetra-substituted phosphonium and a multifunctional phenol compound which are superior in the rapid curing property of the adhesive film and the corrosiveness of an aluminum pad on a semiconductor element, and, furthermore, the storage stability of the adhesive film.

The molecular compounds of tetra-substituted phosphonium and a multifunctional phenol compound may not be mere mixtures, but compounds having a structure, such as a salt structure, a supermolecular structure or the like.

The tetra-substituted phosphonium in the molecular compounds of tetra-substituted phosphonium and a multifunctional phenol compound is preferably a compound having phosphorous atoms coordinated with 4 alkyl groups or aromatic compounds due to the balance of the curing property and storage stability of the adhesive film.

The substituent groups in the tetra-substituted phosphonium are not particularly limited, and may be mutually identical or different, but are preferably tetra-substituted phosphonium ions having substituted or non-substituted aryl groups or alkyl groups as the substituent groups due to the stability with respect to heat or hydrolysis. Specific examples of the tetra-substituted phosphonium include tetraphenylphosphonium, tetratolyl phosphonium, tetraethylphenyl phosphonium, tetramethoxyphenyl phosphonium, tetranaphthyl phosphonium, tetrabenzyl phosphonium, ethyltriphenyl phosphonium, n-butyltriphenyl phosphonium, 2-hydroxyethyltriphenyl phosphonium, trimethylphenyl phosphonium, methyldiethylphenyl phosphonium, methyldiarylphenyl phosphonium, tetra-n-butyl phosphonium or the like, and, among them, tetraphenyl phosphonium is preferable due to the balance of the rapid curing property and storage stability of the adhesive film.

The multifunctional phenol compound in the molecular compound of tetra-substituted phosphonium and a multifunctional phenol compound refers to a compound which includes phenolic hydroxyl groups and has hydrogen in at least one hydroxyl group removed so as to become a phenoxide-type compound, and specific examples include a hydroxybenzene compound, a biphenol compound, a bisphenol compound, a hydroxynaphthalene compound, a phenol novolak resin, a phenol aralkyl resin or the like.

Examples of the multifunctional phenol compound include compounds of a variety of isomers of bisphenols, such as bis(4-hydroxy-3,5-dimethylphenyl)methane (collectively called tetramethylbisphenol F), 4,-4'-sulfonyldiphenol and 4,-4'-isopropylidenephenol (collectively called bisphenol A), bis(4-hydroxyphenyl)methane, bis(2-hydroxyphenyl)methane, (2-hydroxyphenyl)(4-hydroxyphenyl)methane and a mixture of three kinds of bis(4-hydroxyphenyl)methane, bis(2-hydroxyphenyl)methane, (2-hydroxyphenyl)(4-hydroxyphenyl)methane (for example, bisphenol F-D, manufactured by Honshu Chemical Industry Co., Ltd.) or the like; dihydroxybenzenes, such as 1,-2-benzendiol, 1,3-benzendiol, 1,4-benzendiol or the like; trihydroxybenzenes, such as 1,2,4-benzentriol or the like; dihydroxy naphthalenes, such as 1,-6-dihydroxynaphthalene or the like, and compounds of a variety of isomers of biphenols, such as 2,2'-biphenol, 4,-4'-biphenol or the like; and 1,2-dihydroxy naphthalene, 4,4'-sulphonyldiphenol which are excellent in the balance between the rapid curing property and storage stability are preferred.

The resin composition constituting the adhesive film according to the invention may include a coupling agent. Thereby, it is possible to further improve the adhesiveness of the adhesive film and the adhesiveness of the interface between the resin component and a filling material in the adhesive film.

Examples of the coupling agent include silane-based agents, titanium-based agents, aluminum-based agents or the like, and, among them, the silane-based coupling agent which is excellent in the storage stability of the adhesive film and the adhesiveness between the adhesive film and an object to be adhered is preferred.

Examples of the silane coupling agent include vinyl trichlorosilane, vinyl trimethoxysilane, vinyl triethoxysilane, β-(3,4 epoxycyclohexyl)ethyltrimethoxysilane, γ-glycidoxy propyl trimethoxy silane, γ-glycidoxy propyl methyl dimethoxy silane, γ-methacryloxy propyl trimethoxy silane, γ-methacryloxy propyl methyl diethoxy silane, γ-methacryloxy propyl triethoxy silane, N-β(aminoethyl)γ-aminopropyl methyldimethoxysilane, N-β(aminoethyl)γ-aminopropyl trimethoxysilane, N-β(aminoethyl)γ-aminopropyl triethoxysilane, γ-aminopropyltrimethoxyxilane, γ-aminopropyltriethoxyxilane, N-phenyl-γ-aminopropyltrimethoxysilane, γ-chloropropyltrimethoxysilane, γ-mercaptopropyl trimethoxysilane, 3-isocyanate propyltriethoxysilane, 3-acryloxypropyltrimethoxysilane or the like.

The mixing amount of the coupling agent is preferably more than or equal to 0.01 parts by mass and less than or equal to 10 parts by mass, and particularly preferably more than or equal to 0.1 parts by mass and less than or equal to 5 parts by mass with respect to 100 parts by mass of the acrylic resin. With the mixing amount in the above range, it is possible to satisfy both the adhesiveness between the adhesive film and an object to be adhered and the suppression effect of outgas or voids.

In addition, the resin composition constituting the adhesive film may include an inorganic filling material. Thereby, it is possible to improve the pickup property by improving the peeling-off property of an adhesive film-attached semiconductor element from a dicing tape after the dividing of a wafer by dicing and to provide a function that reduces the linear expansion coefficient after curing.

Examples of the inorganic filling material can include silver, titanium oxide, silica, mica or the like, and, among them, silica is preferred. By using a silica filler, it is possible to further improve the pickup property by improving the peeling-off property of an adhesive film-attached semiconductor element from a dicing tape after the dividing of a wafer by dicing. In addition, the shape of the silica filler includes crushed silica and spherical silica, but spherical silica is preferred.

The average grain diameter of the inorganic filling material is not particularly limited, but is preferably more than or equal to 0.01 μm and less than or equal to 20 μm, and particularly preferably more than or equal to 0.1 μm and less than or equal to 5 μm. With the average grain diameter in the above range, it is possible to suppress the aggregation of the filler in the adhesive film and to improve the appearance, and, furthermore, to suppress the fracture of chips during thermocompression-bonding process.

The content of the inorganic filling material is not particularly limited, but is preferably more than or equal to 1 part by mass and less than or equal to 200 parts by mass, and particularly preferably more than or equal to 5 parts by mass and less than or equal to 100 parts by mass with respect to 100 parts by mass of the resin component with an (F) inorganic filling material excluded. With the content in the above range, the difference in the linear expansion coefficient between the adhesive film and an object to be adhered after curing becomes small, and stress generated during thermal shock can be reduced, and therefore it is possible to further reliably suppress the peeling-off of the object to be adhered. Furthermore, since it is possible to prevent the coefficient of elasticity of the adhesive film after curing from becoming too high, the reliability of a semiconductor element rises.

Here, the resin composition constituting the adhesive film according to the invention may include components other than the above components.

The thickness of the adhesive film according to the invention is not particularly limited, but is preferably from 3 μm to 100 μm, and particularly preferably from 5 μm to 70 μm. With the thickness in the above range, the accuracy of thickness can be easily controlled.

Next, a method of manufacturing the adhesive film used in the method of manufacturing a semiconductor device according to the invention will be described.

The adhesive film of the invention can be obtained by, for example, dissolving the above-described resin composition in a solvent, such as methyl ethyl ketone, acetone, toluene, dimethyl formaldehyde or the like so as to make the composition be in a varnish state, then coating and drying the composition on a release sheet using a comma coater, a die coater, gravure coater or the like so as to volatilize the solvent, and then removing the release sheet.

The adhesive film used in the method of manufacturing a semiconductor element according to the invention can be used in the form of a dicing tape-attached adhesive film by combining with a dicing film.

EXAMPLE

Hereinafter, the invention will be described in more detail based on examples and comparative examples, but the invention is not limited thereto.

Example 1

Preparation of a Resin Varnish for an Adhesive Film

Following components were dissolved in methyl ethyl ketone (MEK) so as to obtain a resin wax with a resin solid content of 41%:

as the (meth)acrylic resin, 100 parts by mass of an acrylic acid ester copolymer (ethylacrylate-butylacrylate-acrylonitrile-acrylic acid-hydroxyethyl methacrylate copolymer, manufactured by Nagase ChemteX Corporation, SG-708-6, Tg: 6° C., weight-average molecular weight: 800,000);

as the epoxy resin, 105 parts by mass of EOCN-1020-80 (ortho cresol novolak-type epoxy resin, epoxy equivalent 200 g/eq, softening point 80° C., manufactured by Nippon Kayaku Co., Ltd.) and 157 parts by mass of NC3000P (aralkyl type epoxy resin, epoxy equivalent 272 g/eq, softening point 58° C., manufactured by Nippon Kayaku Co., Ltd.);

as the curing agent, 82 parts by mass of a liquid-phase phenol compound MEH-8000H (hydroxyl group equivalent 141 g/OH group, manufactured by Meiwa Plastic Industries, Ltd.) and 55 parts by mass of a solid-form phenol resin PR-HF-3 (hydroxyl group equivalent 104 g/OH group, manufactured by Sumitomo Bakelite Co., Ltd.);

as the curing accelerator, 0.8 parts by mass of the molecular compound of tetra-substituted phosphonium and a multifunctional phenol compound represented by Formula (1);

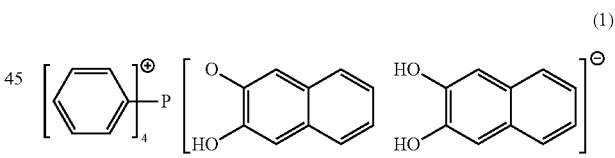

(1)

as the coupling agent, 0.5 parts by mass of γ-glycidoxy propyl trimethoxy silane (KBM403E, manufactured by Shin-Etsu Chemical Co., Ltd.); and as the inorganic filling material, 56 parts by mass of spherical silica (SE2050, average grain diameter 0.5 μm, manufactured by Actmatechs Company Limited).

(Manufacturing of a Release Sheet-Attached Adhesive Film)

The resin varnish obtained by the above-described method was applied to a polyethylene terephthalate film (manufactured by Mitsubishi Chemical Polyester Film Corp., Catalog No. MRX50, thickness 50 μm) which is a releasing sheet using a comma coater and then dried at 100° C. for 5 minutes, and, furthermore, at 150° C. for 2 minutes so as to obtain an adhesive film with a thickness of 30 μm. The melt viscosities of the obtained adhesive film at 100° C., 125° C. and 150° C. measured by giving a shear with a frequency of 1 Hz at a rate of temperature increase of 10° C./minute using a rheometer were 300 Pa·s, 280 Pa·s and 260 Pa·s, respectively.

(Manufacturing of a Dicing Sheet)

As a dicing sheet base material film, a base material film with a thickness of 100 μm was formed with a push bench from Cleartech CT-H717 (manufactured by Kuraray Co., Ltd.) made of 60 parts by mass of HYBRAR and 40 parts by mass of polypropylene, and the surface was subjected to a corona treatment. Next, a copolymer with a weight-average molecular weight of 500,000 obtained by copolymerizing 50 parts by mass of 2-ethylhexyl acrylate, 10 parts by mass of butyl acrylate, 37 parts by mass of vinyl acetate and 3 parts by mass of 2-hydroxyethyl methacrylate was applied to a polyester film with a thickness of 38 μm which had been subjected to a peeling-off treatment so as to have a thickness of 10 μm after drying, and then dried at 80° C. for 5 minutes, thereby obtaining an adhesive layer. Then, the adhesive layer was laminated on the corona-treated surface of the base material film so as to obtain a dicing sheet.

(Manufacturing of a Dicing Sheet-Attached Adhesive Film)

The adhesive film was adhered to the above-described dicing sheet in a size larger than a semiconductor wafer and smaller than the inner diameter of the wafer ring so as to obtain a dicing tape-attached adhesive film formed by stacking the base material film, the adhesive layer and the adhesive film in this order.

(Manufacturing of a Semiconductor Device)

A semiconductor device was manufactured in the following order. As the substrate of the semiconductor device, a simulated organic substrate (with a circuit level difference of from 5 μm to 10 μm) including bismaleimide triazine coated with a solder register (manufactured by Taiyo Ink Mfg. Co., Ltd., AUS308) as the base compound was prepared. Meanwhile, a copper foil, a nickel plate and a gold plate were pattern-treated in turn on portions not coated with the solder register on one surface of the simulated organic substrate so as to form terminals for wire bonding, and electricity was made to flow by areas for mounting solder balls and via holes provided on the other surface of the simulated organic substrate.

The dicing tape-attached adhesive film was adhered at 40° C. to an 8 inch-long and 200 μm-thick wafer on which semiconductor elements had been formed so as to obtain a dicing tape-attached adhesive film-attached wafer.

Then, the wafer was diced (cut) into a size of each semiconductor element of 10.5 mm×10.5 mm using a dicing saw at a spindle rotation speed of 30,000 rpm and a cutting speed of 50 mm/sec. Next, the semiconductor element was pushed up from the rear surface of the dicing tape-attached adhesive film, and peeled off between the base material film and the adhesive layer so as to obtain an adhesive film-attached semiconductor element.

The above adhesive film-attached semiconductor element was thermocompression-bonded on the simulated organic substrate using a die bonder (manufactured by ASM Corp, AD898) under conditions of 130° C., 10 N and 2 seconds, and then a semiconductor part made of the adhesive film-attached semiconductor element and the simulated organic substrate was installed in a pressure vessel and subjected to pressurized curing under conditions of 130° C., 0.5 MPa and 60 minutes using pressurized air. Next, wire bonding was performed between the die pad portion of the semiconductor element and the terminals for wire bonding on the substrate by a wire bonding device (manufactured by ASM Corp, Eagle 60). Furthermore, after sealing was formed with a sealing resin EME-G790 (manufactured by Sumitomo Bakelite Co., Ltd.), a two hour-long thermal treatment was performed at 175° C. as post curing so as to cure the sealing resin and the adhesive film, thereby obtaining a total of 10 semiconductor devices.

Further, the degree of curing of the adhesive film (i) after the thermocompression-bonding, (ii) after the pressurized curing, (iii) after the wire bonding and (iv) after the sealing formation and post curing which was separately measured by the differential scanning calorimetry were (i) 0%, (ii) 45%, (iii) 50% and (iv) 100%, respectively, if the degree of curing of the adhesive film before the thermocompression-bonding was considered 0%.

Comparative Example 1

A semiconductor device was obtained in the same manner as Example 1 except that the pressurized curing process was not performed. Further, the degree of curing of the adhesive film (i) after the thermocompression-bonding, (iii) after the wire bonding and (iv) after the sealing formation and post curing which was separately measured by the differential scanning calorimetry were (i) 0%, (iii) 5% and (iv) 100%, respectively, if the degree of curing of the adhesive film before the thermocompression-bonding was considered 0%.

Comparative Example 2

A semiconductor device was obtained in the same manner as Example 1 except that, instead of performing the pressurized curing process, a heating treatment was performed under conditions of 130° C. and 60 minutes. Further, the degree of curing of the adhesive film (i) after the thermocompression-bonding, (ii) after the heating treatment, (iii) after the wire bonding and (iv) after the sealing formation and post curing which was separately measured by the differential scanning calorimetry were (i) 0%, (ii) 45%, (iii) 50% and (iv) 100%, respectively, if the degree of curing of the adhesive film before the thermocompression-bonding was considered 0%.

The following evaluation was performed on the adhesive films for semiconductors and semiconductor devices obtained in each of Examples and Comparative Examples. Evaluation items are shown together with the contents. The obtained results are shown in Table 1.

1. Low-Temperature Patching Property

The low-temperature patching property was evaluated with 180° peel strength after adhering the adhesive films obtained in each of Examples and Comparative Examples to the rear surface of a wafer with a thickness of 550 μm at a temperature of 40° C., a pressure of 0.3 MPa and a lamination speed of 10 mm/second.

The 180° peel strength was measured using a TENSILON (manufactured by Orientec Co., Ltd., RTC-1250A) by peeling the adhesive films in a 180° direction at a peeling speed of 50 mm/minute and a peeling width of 25 mm.

A: The peel strength was more than or equal to 200 N/m.
B: The peel strength was more than or equal to 100 N/m and less than 200 N/m.
C: The peel strength was more than or equal to 50 N/m and less than 100 N/m.
D: The peel strength was less than 50 N/m.

2. Squeezing Out of the Adhesive Film

Regarding the squeezing out of the adhesive film, it was observed with a SEM whether the adhesive film was squeezed out from the side surfaces of the semiconductor elements after the wire bonding in the semiconductor devices manufactured in each of Examples and Comparative Examples. Each mark has the following meaning.

A: The squeezing out lengths from the side surfaces were less than 20 μm
B: The squeezing out lengths from the side surfaces were more than or equal to 20 μm and less than 50 μm.

C: The squeezing out lengths from the side surfaces were more than or equal to 50 μm and less than 100 μm.
D: The squeezing out lengths from the side surfaces were more than 100 μm.

3. Presence of Voids and Cavities Before the Sealing Formation

The presence of voids and cavities before the sealing formation was evaluated with a Scanning Acoustic Tomograph (SAT) for the semiconductor devices, for which the resin was yet to be sealed, obtained in each of Examples and Comparative Examples. Each mark has the following meaning.
A: The number of semiconductor devices having voids or cavities with a size of more than or equal to 30 μm left was 0 out of 10.
B: The number of semiconductor devices having voids or cavities with a size of more than or equal to 30 μm left was more than or equal to 1 and less than or equal to 3 out of 10.
C: The number of semiconductor devices having voids or cavities with a size of more than or equal to 30 μm left was more than or equal to 4 and less than or equal to 9 out of 10.
D: The number of semiconductor devices having voids or cavities with a size of more than or equal to 30 μm left was 10 out of 10.

Further, in Example 1, all the semiconductor devices had no void or cavity with a size of more than or equal to 10 μm left.

4. Presence of Voids and Cavities after the Sealing Formation+Post Curing

The presence of voids and cavities after the sealing formation and post curing was evaluated with a Scanning Acoustic Tomograph (SAT) for the semiconductor devices, for which the resin was yet to be sealed, obtained in each of Examples and Comparative Examples. Each mark has the following meaning.
A: The number of semiconductor devices having voids or cavities with a size of more than or equal to 30 μm left was 0 out of 10.
B: The number of semiconductor devices having voids or cavities with a size of more than or equal to 30 μm left was more than or equal to 1 and less than or equal to 3 out of 10.
C: The number of semiconductor devices having voids or cavities with a size of more than or equal to 30 μm left was more than or equal to 4 and less than or equal to 9 out of 10.
D: The number of semiconductor devices having voids or cavities with a size of more than or equal to 30 μm left was 10 out of 10.

Further, in Example 1, all the semiconductor devices had no void or cavity with a size of more than or equal to 10 μm left.

5. Cracking Resistance

The cracking resistance was evaluated by observing crackings generated due to reflow with a Scanning Acoustic Tomograph (SAT) after performing a moisture absorption treatment on the semiconductor devices obtained in each of Examples and Comparative Examples at 85° C. and 65% RH for 168 hours and then performing IR reflow at 260° C. three times. Each mark has the following meaning.
A: The number of crackings generated was 0 out of 10.
B: The number of crackings generated was more than or equal to 1 and less than or equal to 3 out of 10.
C: The number of crackings generated was more than or equal to 4 and less than or equal to 9 out of 10.
D: The number of crackings generated was 10 out of 10.

[Table 1]

| | Pressurized curing conditions | Low-temperature patching property | Squeezing out of the adhesive film | Voids and cavities before the sealing formation | Voids and cavities after the sealing formation and post curing | Reflow resistance |
|---|---|---|---|---|---|---|
| Example 1 | 130° C. 0.5 MPa 1 Hour | A | A | A | A | A |
| Comparative Example 1 | No pressurization No heating | A | C | C | D | D |
| Comparative Example 2 | 130° C. 1 Hour (No pressurization) | A | B | B | C | D |

As is clear from Table 1, Example 1 which is the method of manufacturing a semiconductor device according to the invention obtained good results which included no voids inside the adhesive film and no cavities in the interfaces between the adhesive film and the semiconductor elements and in the interface between the adhesive film and the substrate, which exceeded 30 μm, and showed no squeezing out of the adhesive. In addition, Example 1 obtained good results which showed no occurrence of cracking or peeling-off even with solder-resistant reflow treatments after moisture absorption in the semiconductor devices.

On the other hand, Comparative Examples 1 and 2 in which no pressurized curing process was performed produced results which showed the occurrence of voids inside the adhesive film and cavities in the interfaces between the adhesive film and the semiconductor elements and in the interface between the adhesive film and the substrate, which exceeded 30 μm. Therefore, Comparative Examples 1 and 2 produced results in which cracking or peeling-off occurred with solder-resistant reflow treatments after moisture absorption in the semiconductor devices.

The present application claims priority based on Japanese Patent Application No. 2008-267030 and Japanese Patent Application No. 2009-105605, and the contents are incorporated by reference herein.

The invention claimed is:
1. A method of manufacturing a semiconductor device comprising a semiconductor element and a support member adhered to the semiconductor element through a cured material of an adhesive film, wherein the method comprises the steps (a) to (d) in this order:
(a) preparing adhesive film-attached semiconductor elements;
(b) placing the adhesive film-attached semiconductor elements on said support member;
(c) thermocompression-bonding said adhesive film-attached semiconductor elements to said support member so as to obtain a semiconductor part made of said adhesive film-attached semiconductor elements and said support member;
(d) heating and pressurizing said semiconductor part made of said adhesive film-attached semiconductor elements and said support member using a pressurized fluid so as to proceed with curing of adhesive film; and
(e) electrically connecting said adhesive film-attached semiconductor elements and said support member.

2. The method of manufacturing a semiconductor device according to claim 1,
wherein before the step (a) is conducted, said adhesive film has the viscosity of more than or equal to 10 Pa·s and less than or equal to 1000 Pa·s at the temperature of 100° C. to 150° C.

3. The method of manufacturing a semiconductor device according to claim 1,
wherein said pressurized fluid is a pressurized gas.

4. The method of manufacturing a semiconductor device according to claim 1,
wherein said pressurized fluid is pressurized air.

5. The method of manufacturing a semiconductor device according to claim 1,
wherein said step of heating and pressurizing said semiconductor part (d) comprises placing said semiconductor part composed of said adhesive film-attached semiconductor elements and said support member in a pressure vessel, and heating and pressurizing said semiconductor part using the pressurized fluid.

6. The method of manufacturing a semiconductor device according to claim 1,
wherein, said step of heating and pressurizing said semiconductor part (d) is conducted under the condition of a heating temperature of more than or equal to 80° C. and less than or equal to 180° C., a welding pressure of more than or equal to 0.1 MPa and less than or equal to 10 MPa, and a pressurization time of more than or equal to 1 minute and less than or equal to 480 minutes.

7. The method of manufacturing a semiconductor device according to claim 1,
wherein said adhesive film comprises a resin including a (meth)acrylic resin, wherein the (meth)acrylic resin has the amount of more than or equal to 10% and less than or equal to 50% with respect to the total amount of the resin.

8. The method of manufacturing a semiconductor device according to claim 7,
wherein said adhesive film further comprises a thermosetting resin, wherein said (meth)acrylic resin has the amount of more than or equal to 10 parts by mass and less than or equal to 100 parts by mass with respect to 100 parts by mass of said thermosetting resin.

9. The method of manufacturing a semiconductor device according to claim 1,
wherein voids and cavities are reduced by conducting said step of heating and pressurizing said semiconductor part (d), and therefore no void with a diameter of more than or equal to 30 μm is present inside said adhesive film after said step (d) is conducted.

10. The method of manufacturing a semiconductor device according to claim 1,
wherein said step of preparing the adhesive film-attached semiconductor elements (a) comprises the steps (a1) to (a3) in this order;
(a1) laminating a dicing tape-attached adhesive film over a rear surface of a wafer so that said wafer so as to said adhesive film and said dicing tape are laminated in this order;
(a2) dicing said wafer and said laminated dicing tape-attached adhesive film; and
(a3) peeling said dicing tape off so as to form an adhesive film-attached semiconductor element.

11. A semiconductor device manufactured by the method of manufacturing a semiconductor device according to claim 1.

12. The method of manufacturing a semiconductor device according to claim 1,
wherein said step of preparing the adhesive film-attached semiconductor elements (a) comprises the steps (a1) to (a4) in this order:
(a1) laminating a dicing tape-attached adhesive film over a rear surface of a wafer so that said wafer so as to said adhesive film and said dicing tape are laminated in this order;
(a2) dicing said wafer and said laminated dicing tape-attached adhesive film to form a diced semiconductor element;
(a3) expanding said dicing tape so as to break up the diced semiconductor element at uniform interval; and
(a4) peeling said dicing tape off so as to form an adhesive film-attached semiconductor element.

* * * * *